US011615959B2

(12) United States Patent
Lee et al.

(10) Patent No.: US 11,615,959 B2
(45) Date of Patent: Mar. 28, 2023

(54) SILICON CARBIDE SEMICONDUCTOR DEVICE AND MANUFACTURING METHOD THEREOF

(71) Applicant: Hestia Power Shanghai Technology Inc., Shanghai (CN)

(72) Inventors: Lurng-Shehng Lee, Hsinchu (TW); Chien-Chung Hung, Hsinchu (TW); Chwan-Ying Lee, Hsinchu (TW)

(73) Assignee: HESTIA POWER SHANGHAI TECHNOLOGY INC., Shanghai (CN)

( * ) Notice: Subject to any disclaimer, the term of this patent is extended or adjusted under 35 U.S.C. 154(b) by 39 days.

(21) Appl. No.: 17/462,324

(22) Filed: Aug. 31, 2021

(65) Prior Publication Data

US 2023/0064733 A1 Mar. 2, 2023

(51) Int. Cl.
- *H01L 21/04* (2006.01)
- *H01L 29/16* (2006.01)
- *H01L 21/322* (2006.01)
- *H01L 29/45* (2006.01)

(52) U.S. Cl.
CPC ...... *H01L 21/0485* (2013.01); *H01L 21/3221* (2013.01); *H01L 29/1608* (2013.01); *H01L 29/45* (2013.01)

(58) Field of Classification Search
None
See application file for complete search history.

(56) References Cited

U.S. PATENT DOCUMENTS

| | | | |
|---|---|---|---|
| 2008/0258161 A1* | 10/2008 | Edmond | H01L 33/42 257/E33.068 |
| 2017/0309752 A1* | 10/2017 | Yamazaki | H01L 27/1052 |
| 2020/0044031 A1* | 2/2020 | Pham | H01L 21/0485 |

FOREIGN PATENT DOCUMENTS

| | | | | |
|---|---|---|---|---|
| CN | 101371370 A | * | 2/2009 | ....... H01L 21/02293 |
| JP | 2015167220 A | * | 9/2015 | ........... H01L 21/324 |
| TW | 201639167 A | * | 11/2016 | ........... H01L 21/324 |
| WO | WO-2013046863 A1 | * | 4/2013 | ....... H01L 21/28575 |
| WO | WO-2017039208 A1 | * | 3/2017 | ....... G02F 1/133603 |

* cited by examiner

*Primary Examiner* — Michael Lebentritt
(74) *Attorney, Agent, or Firm* — Muncy, Geissler, Olds & Lowe, P.C.

(57) ABSTRACT

A silicon carbide (carborundum) semiconductor device and a manufacturing method thereof. The manufacturing method of the silicon carbide semiconductor device comprises the following steps of: providing a semiconductor component structure on a silicon carbide substrate, the semiconductor component structure being formed on a front side of the silicon carbide substrate; and forming a multi-layer structure on a back side of the silicon carbide substrate, the multi-layer structure comprising a plurality of ohmic contact layers and a plurality of gettering material layers. By dispersing the gettering material into multiple layers, and by adjusting a thickness combination of the ohmic contact layer and the gettering material layer, even if the gettering material layer is relatively thin (thickness sufficient for balling), a content is still sufficient for gettering carbon and reducing carbon aggregation and accumulation.

13 Claims, 4 Drawing Sheets

SILICON CARBIDE SEMICONDUCTOR DEVICE AND MANUFACTURING METHOD THEREOF

FIELD OF THE INVENTION

The invention relates to a semiconductor device, and more particularly to a silicon carbide semiconductor device and a manufacturing method thereof.

BACKGROUND OF THE INVENTION

The characteristics of semiconductor component usually require high breakdown voltage, as well as the smallest possible conduction resistance, low reverse leakage current, and faster switching speed to reduce conduction loss and switching loss during operation. Since silicon carbide (SiC for short) has the characteristics of wide bandgap (Eg=3.26 eV), high critical breakdown electric field strength (2.2 MV/cm), and high thermal conductivity coefficient (4.9 W/cm-K), silicon carbide is considered an excellent material for power switching component. Under the same breakdown voltage condition, a thickness of the voltage-withstand layer (drift layer with low doping concentration) of the power component made of silicon carbide as the base material is only one tenth of a thickness of the silicon (Si) power component, and theoretically the conduction resistance can reach a few hundredths of that of silicon.

However, after the power component made of silicon carbide as the base material is processed with manufacturing procedures of grinding, annealing, and deposition, and reacting with nickel to form nickel silicide, the excess carbon atoms tend to aggregate and accumulate in the grain boundary, resulting in stripping and cracking between the multi-layer structures of the semiconductor device, causing the resistance value to increase substantially, and at the same time affecting the reliability of the semiconductor device.

SUMMARY OF THE INVENTION

A main object of the invention is to solve the problems of stripping and cracking between multi-layer structures due to accumulation of carbon material during a manufacturing process of the multi-layer structures of the conventional silicon carbide semiconductor device, and to avoid an increase of resistance value between the devices.

In order to achieve the above-mentioned object, the invention provides a manufacturing method of a silicon carbide semiconductor device comprising the following steps of: providing a semiconductor component structure formed on a front side of a silicon carbide substrate; and providing a multi-layer structure on a back side of the silicon carbide substrate, the multi-layer structure comprises a first ohmic contact layer formed on the back side, a first gettering material layer formed on the first ohmic contact layer, a second ohmic contact layer formed on the first gettering material layer, a second gettering material layer formed on the second ohmic contact layer, and a third ohmic contact layer formed on the second gettering material layer.

In one embodiment of the invention, the manufacturing method further comprises a step of laser annealing on the multi-layer structure after the multi-layer structure is provided.

In one embodiment of the invention, the manufacturing method further comprises a step of forming a metal layer on a side of the multi-layer structure opposite to the silicon carbide substrate after the step of laser annealing.

In one embodiment of the invention, the ohmic contact layers are made of a material of nickel, nickel/silicon bi-layer, nickel silicide or a combination thereof.

In one embodiment of the invention, the gettering material layers are made of a material of titanium, molybdenum, tungsten, tantalum or a combination thereof.

In one embodiment of the invention, a total thickness of the multi-layer structure is between 105 nm and 405 nm.

In one embodiment of the invention, the ohmic contact layers have a thickness between 25 nm and 120 nm respectively, and the gettering material layers have a thickness between 15 nm and 45 nm respectively.

In one embodiment of the invention, a thickness of the ohmic contact layer is greater than a thickness of the gettering material layer.

In order to achieve the above-mentioned object, the invention further provides a silicon carbide semiconductor device manufactured by the manufacturing method.

In order to achieve the above-mentioned object, the invention provides a manufacturing method of a silicon carbide semiconductor device comprising the following steps of: providing a semiconductor component structure formed on a front side of a silicon carbide substrate; providing a first multi-layer structure on a back side of the silicon carbide substrate, wherein the first multi-layer structure comprises a plurality of ohmic contact layers and at least one gettering material layer disposed between the plurality of ohmic contact layers; performing a step of first laser annealing on the first multi-layer structure to form a first ohmic contact on the first multi layer structure, wherein the first ohmic contact is adhered to the silicon carbide substrate; providing a second multi-layer structure on the first ohmic contact, wherein the second multi-layer structure comprises the at least one gettering material layer and at least one of the ohmic contact layers disposed on the gettering material layer; and performing a step of second laser annealing on the second multi-layer structure to form a second ohmic contact on the second multi-layer structure and the first ohmic contact collectively, wherein the second ohmic contact is adhered to the silicon carbide substrate.

In one embodiment of the invention, a total thickness of the first multi-layer structure is between 65 nm and 285 nm.

In one embodiment of the invention, a total thickness of the second multi-layer structure is between 40 nm and 165 nm.

In one embodiment of the invention, a thickness of the ohmic contact layer is between 25 nm and 120 nm, and a thickness of the gettering material layer is between 15 nm and 45 nm.

DETAILED DESCRIPTION OF THE PREFERRED EMBODIMENTS

Figure 1A:
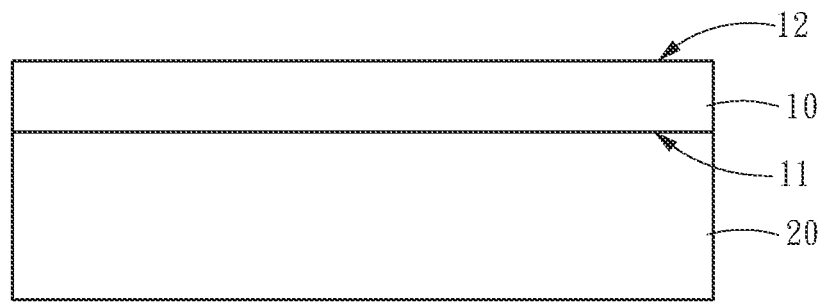
FIG. 1A-D are schematic diagrams of a manufacturing process of a first embodiment of the invention.

The invention provides a manufacturing method of a silicon carbide semiconductor device, please refer to FIG. 1A-D for schematic diagrams of a manufacturing process of a first embodiment of the invention. As shown in FIG. 1A, a silicon carbide substrate 10 and a semiconductor component structure 20 are provided first. The silicon carbide substrate 10 comprises a front side 11 and a back side 12 opposite to the front side 11. The semiconductor component structure 20 is disposed on the front side 11 of the silicon carbide substrate 10. In the invention, the semiconductor component structure 20 is a vertical semiconductor power component structure, thereby the semiconductor component structure 20 forms a power transistor component on the silicon carbide substrate 10, such as metal oxide semiconductor field effect transistor (MOSFET), junction field effect transistor (JFET), and insulated gate bipolar transistor (IGBT). After the semiconductor component structure 20 is disposed, a backside grinding step is optionally performed on the back side 12 of the silicon carbide substrate 10 until it is thinned to a thickness between 50 μm and 150 μm. In addition, a dry etching is optionally performed on the back side 12 of the silicon carbide substrate 10 to release stress after the backside grinding step.

Figure 1B:
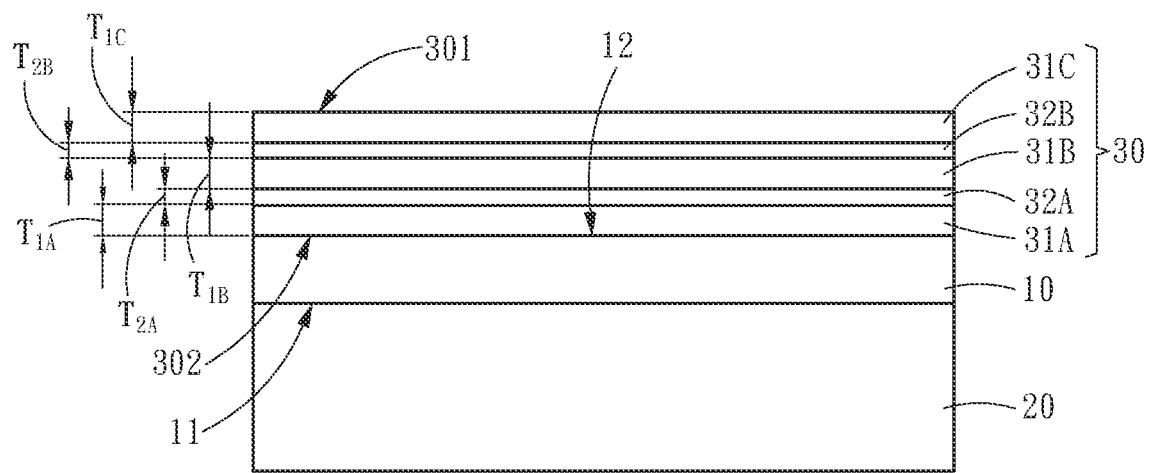

As shown in FIG. 1B, a plurality of ohmic contact layers and a plurality of gettering material layers are alternately deposited on the back side 12 of the silicon carbide substrate 10 to form a multi-layer structure 30. The multi-layer structure 30 comprises a first ohmic contact layer 31A formed on the back side 12, a first gettering material layer 32A formed on the first ohmic contact layer 31A, a second ohmic contact layer 31B formed on the first gettering material layer 32A, a second gettering material layer 32B formed on the second ohmic contact layer 31B, and a third ohmic contact layer 31C formed on the second gettering material layer 32B. In this embodiment, the first ohmic contact layer 31A, the first gettering material layer 32A, the second ohmic contact layer 31B, the second gettering material layer 32B, and the third ohmic contact layer 31C are deposited sequentially.

The ohmic contact layers 31A, 31B, 31C and the gettering material layers 32A, 32B are formed by techniques such as evaporation, sputtering, chemical vapor deposition, or spin coating. The ohmic contact layers 31A, 31B, 31C are metals or metal compounds for forming ohmic contact. The ohmic contact layers 31A, 31B, 31C are made of a material selected from a group consisting of nickel, nickel/silicon bi-layer or nickel silicide. The gettering material layers 32A, 32B comprise at least one gettering material for gettering carbon diffused from the silicon carbide substrate 10 in a subsequent manufacturing process. The gettering material layers 32A, 32B are made of at least one material selected from a group consisting of titanium, molybdenum, tungsten, tantalum or a combination of the above elements. In this embodiment, the gettering material layers 32A, 32B are composed of only a single type of gettering material.

Figure 1C:
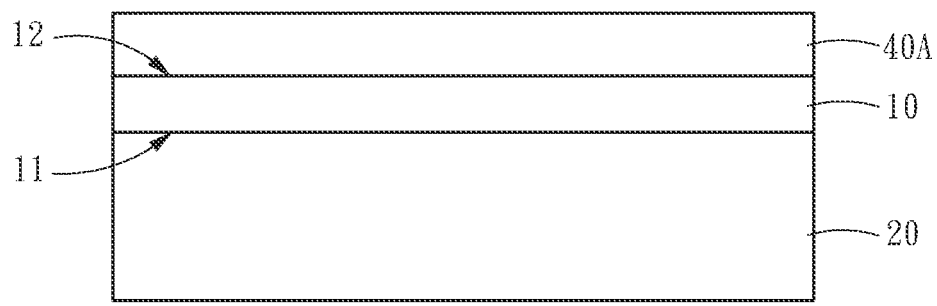

As shown in FIG. 1B and FIG. 1C, a laser annealing step is performed on the multi-layer structure 30 to form an ohmic contact 40A, after the multi-layer structure 30 is deposited. When the multi-layer structure 30 is performed with the laser annealing, the composition of the multi-layer structure 30 diffuses downward, and the composition of the silicon carbide substrate 10 diffuse upwards. The silicon carbide substrate 10 reacts with the metal of the ohmic contact layers 31A, 31B, 31C to form metal silicide (such as nickel silicide), and carbon precipitates. The precipitated carbon is gettered by the gettering material of the gettering material layer 32A, 32B to react and form carbon compound (such as titanium carbide), thereby preventing the precipitated carbon from remaining on an interface between the silicon carbide substrate 10 and the ohmic contact 40A and/or on an upper surface of the ohmic contact 40A, or preventing from forming defects of carbon cluster or interstitial carbon. The aforementioned defects cause problems such as interface stripping and cracking, and increase a resistance value. In different embodiments, a light source of the laser annealing step is selected from ultraviolet light or green laser, a temperature of the laser annealing step is between 800° C. and 1500° C., and the time of the laser annealing step is between 10 ns and 150 ns.

Figure 1D:
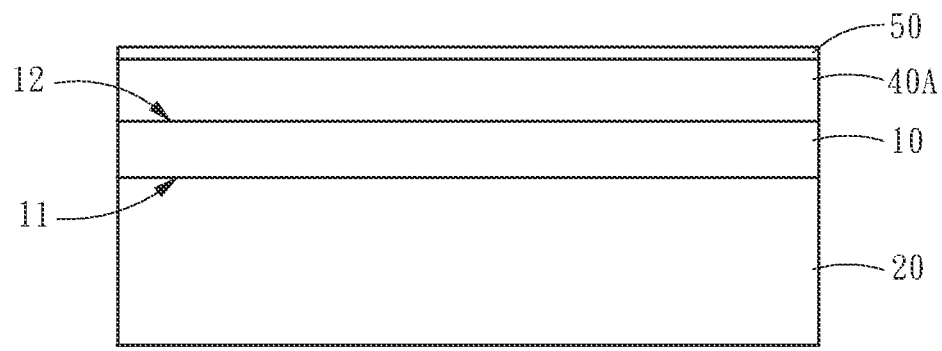

As shown in FIG. 1D, after the laser annealing step, a metal layer 50 is disposed on another side of the ohmic contact 40A opposite to the silicon carbide substrate 10. In other embodiments, before the metal layer 50 is disposed, a nickel silicide layer is deposited first, and then the metal layer 50 is deposited.

In the invention, the multi-layer structure 30 comprises at least three thick ohmic contact layers and at least two thin gettering material layers sandwiched between the thick ohmic contact layers. In terms of thickness design, an total thickness of the multi-layer structure 30 needs to be appropriate. If a thickness of the multi-layer structure 30 is too thick, too much of the silicon carbide substrate 10 will be consumed; if a thickness of the multi-layer structure 30 is too thin, it will be incapable of forming the effective ohmic contact 40A. Low contact resistance is obtained when total thickness of the multi-layer structure 30 is appropriate. According to one embodiment of the invention, a total thickness of the multi-layer structure 30 is between 105 nm and 450 nm, preferably between 150 nm and 200 nm. A thickness of the ohmic contact 40A is between 200 nm and 600 nm, and a thickness of the ohmic contact 40A after the laser annealing step is greater than a thickness of the multi-layer structure 30 before the laser annealing step.

In the conventional technique, a single gettering material layer is used, if the single gettering material layer is too thin, the gettering material will not be sufficient to react with the carbon escaped from the silicon carbide substrate; but if the single gettering material layer is too thick, under a high temperature of laser annealing, the gettering material will be incapable of balling, so it will be incapable of reacting with the carbon of the silicon carbide substrate, and will also affect the diffusion of silicon of the silicon carbide substrate. Moreover, the oversaturated gettering material will react with the silicon of the silicon carbide substrate 10 to form metal silicide (such as Ti silicide), which will have an adverse effect on the component.

Figure 2:
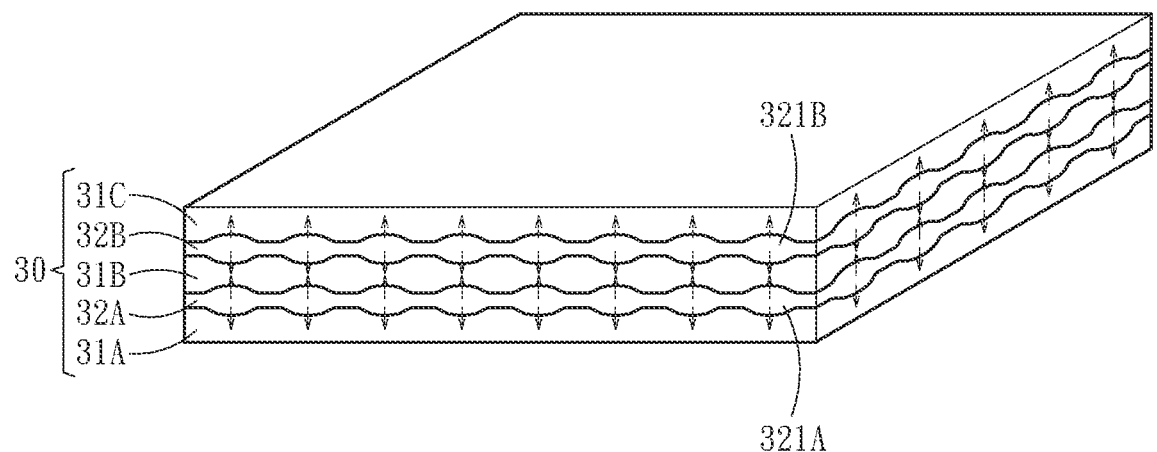
FIG. 2 is a schematic diagram of balling of a gettering material in one embodiment of the invention.

Please refer to FIG. 2 for a schematic diagram of balling of a gettering material in one embodiment of the invention. In order to solve the aforementioned problems in the conventional technique, the invention provides at least the two gettering material layers 32A, 32B in the multi-layer structure 30 used for an ohmic contact, and the gettering material layers 32A, 32B will form ballings 321A, 321B during high temperature annealing. By dispersing the gettering material into multiple layers, the gettering material is expanded to a three-dimensional structure, and is capable of exerting a gettering effect in a vertical direction (as shown by the arrows in FIG. 2.) By adjusting a thickness combination of the ohmic contact layers 31A, 31B, 31C and the gettering material layers 32A, 32B, even if the gettering material layers 32A, 32B are relatively thin (thickness sufficient for balling), a content is still sufficient for gettering carbon without affecting the diffusion of carbon of the silicon carbide substrate 10 in order to achieve an optimal gettering ability.

Please refer to FIG. 1B, thicknesses $T_{1A}$, $T_{1B}$, $T_{1C}$ of the ohmic contact layers 31A, 31B, 31C in this embodiment are respectively greater than thicknesses $T_{2A}$, $T_{2B}$ of the gettering material layers 32A, 32B. In other words, any one of the thicknesses $T_{1A}$, $T_{1B}$, $T_{1C}$ of the ohmic contact layers 31A, 31B, 31C is greater than any one of the thicknesses $T_{2A}$, $T_{2B}$ of the gettering material layers 32A, 32B. The thicknesses $T_{1A}$, $T_{1B}$, $T_{1C}$ of the ohmic contact layers 31A, 31B, 31C are between 25 nm and 120 nm, respectively, the thicknesses $T_{1A}$, $T_{1B}$, $T_{1C}$ of the ohmic contact layers 31A, 31B, 31C are the same or different. The thicknesses $T_{2A}$, $T_{2B}$ of the gettering material layers 32A, 32B are between 15 nm and 45 nm, respectively, the thicknesses $T_{2A}$, $T_{2B}$ of the gettering material layers 32A, 32B are the same or different. According to one embodiment of the invention, the thicknesses $T_{1A}$, $T_{1B}$, $T_{1C}$ of the ohmic contact layers 31A, 31B, 31C are between 40 nm and 60 nm, respectively, and the thicknesses $T_{2A}$, $T_{2B}$ of the gettering material layers 32A, 32B are between 20 nm and 30 nm, respectively. According to another embodiment of the invention, the thicknesses $T_{1A}$, $T_{1B}$, $T_{1C}$ of the ohmic contact layers 31A, 31B, 31C are each 50 nm, and the thicknesses $T_{2A}$, $T_{2B}$ of the gettering material layers 32A, 32B are each 25 nm.

In this embodiment, a distance between the gettering material layer 32A and a lower surface 302 of the multi-layer structure 30 is equal to a distance between the gettering material layer 32B and an upper surface 301 of the multi-layer structure 30, in other words, the thicknesses $T_{1A}$, $T_{1C}$ of the ohmic contact layers 31A, 31C are the same. According to one embodiment of the invention, a distance between the gettering material layer 32A and the lower surface 302 of the multi-layer structure 30 is greater than a distance between the gettering material layer 32B and the upper surface 301 of the multi-layer structure 30, so that the ohmic contact layer 31A has sufficient content to react with the silicon carbide substrate 10 below to avoid poor adhesion. For example, the thicknesses $T_{1A}$, $T_{1B}$, $T_{1C}$ of the ohmic contact layers 31A, 31B, 31C are 25 nm, 50 nm, and 75 nm, respectively, and the thicknesses $T_{2A}$, $T_{2B}$ of the gettering material layers 32A, 32B are each 25 nm.

According to other embodiments of the invention, the ohmic contact layer 31 and the gettering material layer 32 is achieved by using other quantity combinations, such as four layers of the ohmic contact layer 31 and three layers of the gettering material layer 32; or five layers of the ohmic contact layer 31 and four layers of the gettering material layer 32. In the aforementioned combinations, a thickness of the gettering material layer 32 is less than 15 nm. In this way, at a high temperature of laser annealing, the gettering material of the gettering material layer 32 is capable of forming more balls.

Based on the multi-layer structure 30, the invention effectively reduces the carbon escaped from the silicon carbide substrate 10 to accumulate in the multi-layer structure 30, and solves the problems of easy stripping and cracking of the conventional ohmic contact, thereby avoiding an increase in resistance value.

Please refer to FIG. 3A-E for schematic diagrams of a manufacturing process of a second embodiment of the invention. The difference between this embodiment and the embodiment of FIG. 1A-D is that the multi-layer structure 30 is performed with at least two times of the laser annealing step.

Figure 3A:
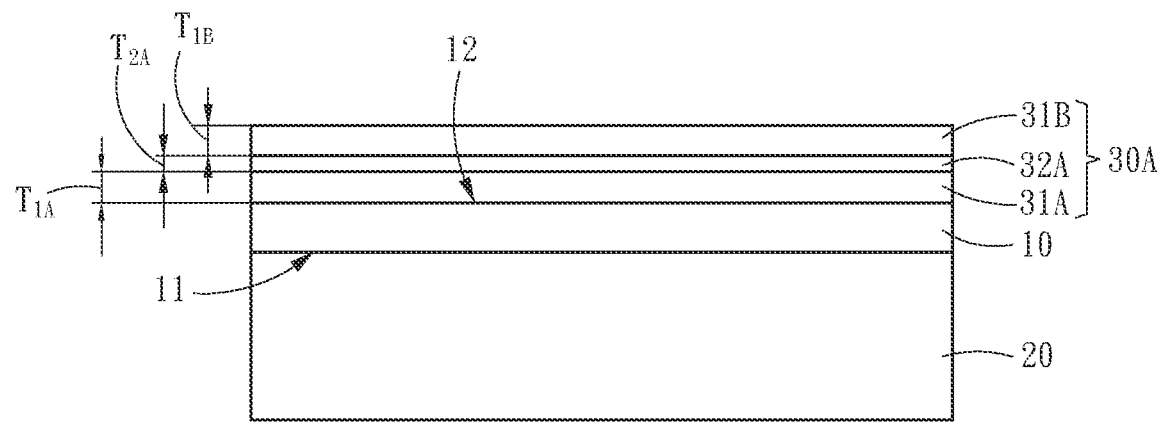
FIG. 3A-E are schematic diagrams of a manufacturing process of a second embodiment of the invention.
Figure 3B:
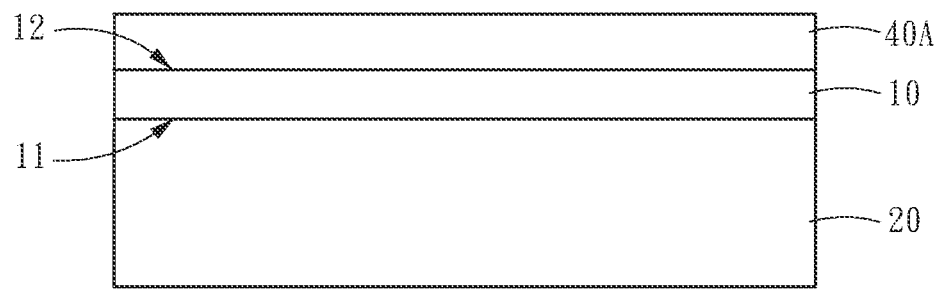

First, as shown in FIG. 3A and FIG. 3B, the first ohmic contact layer 31A, the first gettering material layer 32A, and the second ohmic contact layer 31B are deposited on the back side 12 of the silicon carbide substrate 10 in sequence, and a first multi-layer structure 30A is formed on the back side 12 of the silicon carbide substrate 10. A first laser annealing step is performed on the first multi-layer structure 30A to form a first ohmic contact 40A, wherein a thickness of the first multi-layer structure 30A is between 65 nm and 285 nm.

Figure 3C:
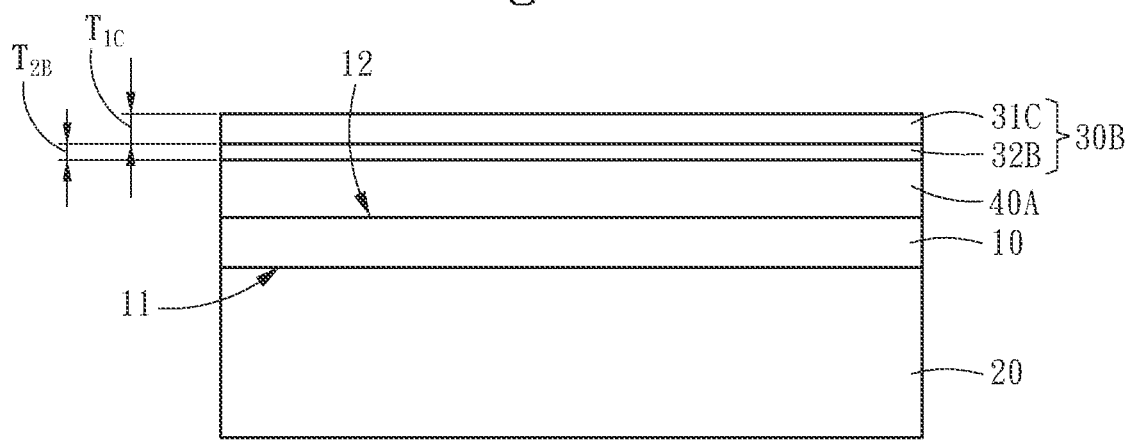
Figure 3D:
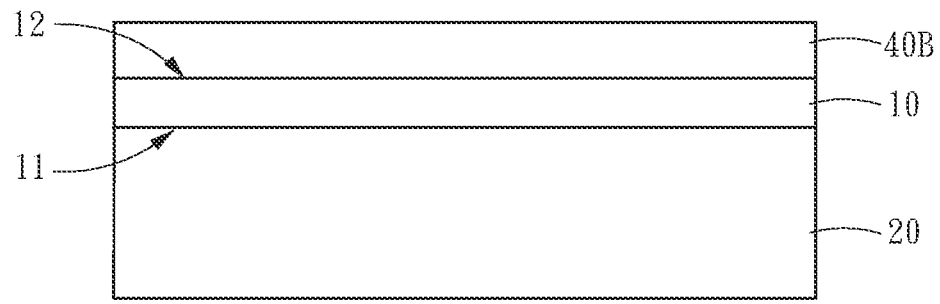

Then, as shown in FIG. 3C and FIG. 3D, the second gettering material layer 32B and the third ohmic contact layer 31C are sequentially deposited on the first ohmic contact 40A, and a second multi-layer structure 30B is formed on the first ohmic contact 40A. After the second multi-layer structure 30B is deposited, a second laser annealing step is performed on the second multi-layer structure 30B, so that the first ohmic contact 40A and the second multi-layer structure 30B collectively form a second ohmic contact 40B, wherein a thickness of the second multi-layer structure 30B is between 40 nm and 165 nm. In this embodiment, thicknesses and quantities of the first ohmic contact layer 31A, the first gettering material layer 32A, the second ohmic contact layer 31B, the second gettering material layer 32B, and the third ohmic contact layer 31C is selected as in the above-mentioned embodiment.

Figure 3E:
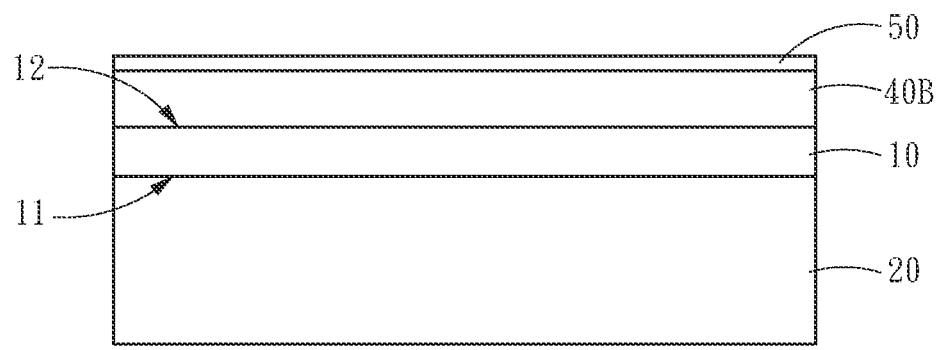

As shown in FIG. 3E, after laser annealing, the metal layer 50 is disposed on another side of the second ohmic contact 40B opposite to the silicon carbide substrate 10. In other embodiments, before the metal layer 50 is disposed, a nickel silicide layer is deposited first, and then the metal layer 50 is deposited.

As a result, the second ohmic contact 40B undergoes two times of the laser annealing step, so that the second ohmic contact 40B has a better crystallization effect and is capable of gettering carbon more effectively, thereby greatly improving its adhesion ability.

In summary, the invention puts the at least two thin gettering material layers in the multi-layer structure for forming ohmic contact, and by designing the gettering material as a multi-thin layer structure, the gettering material layer is capable of balling effectively on different planes and providing sufficient content. Therefore, without affecting the diffusion of silicon of the silicon carbide substrate, carbon is fully gettered, thereby preventing the precipitated carbon from remaining on the interface between the silicon carbide substrate and the ohmic contact layer and/or on the upper surface of the ohmic contact layer, or preventing from forming defects of carbon cluster or interstitial carbon, thereby increasing a degree of adhesion of the interface. Also, by reducing defects and avoiding an increase in resistance value, performance of the silicon carbide semiconductor device is improved.

What is claimed is:

1. A manufacturing method of a silicon carbide semiconductor device, comprising the following steps of:
   providing a semiconductor component structure formed on a front side of a silicon carbide substrate; and
   providing a multi-layer structure on a back side of the silicon carbide substrate, wherein the multi-layer structure comprises a first ohmic contact layer formed on the back side, a first gettering material layer formed on the first ohmic contact layer, a second ohmic contact layer formed on the first gettering material layer, a second gettering material layer formed on the second ohmic contact layer, and a third ohmic contact layer formed on the second gettering material layer.

2. The manufacturing method of claim 1, wherein the manufacturing method further comprises a step of laser annealing on the multi-layer structure after the multi-layer structure is provided.

3. The manufacturing method of claim 2, wherein the manufacturing method further comprises a step of forming a metal layer on a side of the multi-layer structure opposite to the silicon carbide substrate after the step of laser annealing.

4. The manufacturing method of claim 1, wherein the first ohmic contact layer, the second ohmic contact layer, and the third ohmic contact layer are made of a material of nickel, nickel/silicon bi-layer, nickel silicide or a combination thereof.

5. The manufacturing method of claim 1, wherein the first gettering material layer and the second gettering material layer are made of at least one material of titanium, molybdenum, tungsten, tantalum or a combination thereof.

6. The manufacturing method of claim 1, wherein a total thickness of the multi-layer structure is between 105 nm and 405 nm.

7. The manufacturing method of claim 1, wherein the first ohmic contact layer, the second ohmic contact layer, and the third ohmic contact layer have a thickness between 25 nm and 120 nm respectively, and the first gettering material layer and the second gettering material layer have a thickness between 15 nm and 45 nm respectively.

8. The manufacturing method of claim 1, wherein a thickness of any one of the first ohmic contact layer, the second ohmic contact layer, and the third ohmic contact layer is greater than a thickness of any one of the first gettering material layer and the second gettering material layer.

9. A silicon carbide semiconductor device manufactured by the method of claim 1.

10. A manufacturing method of a silicon carbide semiconductor device, comprising the following steps of:

providing a semiconductor component structure formed on a front side of a silicon carbide substrate;

providing a first multi-layer structure on a back side of the silicon carbide substrate, wherein the first multi-layer structure comprises a plurality of ohmic contact layers and at least one gettering material layer disposed between the plurality of ohmic contact layers;

performing a step of first laser annealing on the first multi-layer structure to form a first ohmic contact on the first multi layer structure, wherein the first ohmic contact is adhered to the silicon carbide substrate;

providing a second multi-layer structure on the first ohmic contact, wherein the second multi-layer structure comprises the at least one gettering material layer and at least one of the ohmic contact layers disposed on the gettering material layer; and performing a step of second laser annealing on the second multi-layer structure to form a second ohmic contact on the second multi-layer structure and the first ohmic contact collectively, wherein the second ohmic contact is adhered to the silicon carbide substrate.

11. The manufacturing method of claim 10, wherein a total thickness of the first multi-layer structure is between 65 nm and 285 nm.

12. The manufacturing method of claim 10, wherein a total thickness of the second multi-layer structure is between 40 nm and 165 nm.

13. The manufacturing method of claim 10, wherein a thickness of the ohmic contact layer is between 25 nm and 120 nm, and a thickness of the gettering material layer is between 15 nm and 45 nm.

\* \* \* \* \*